United States Patent
Bhattacharya et al.

(10) Patent No.: US 7,511,550 B2
(45) Date of Patent: Mar. 31, 2009

(54) METHOD AND APPARATUS FOR IMPROVING RELIABILITY OF AN INTEGRATED CIRCUIT HAVING MULTIPLE POWER DOMAINS

(75) Inventors: Dipankar Bhattacharya, Macungie, PA (US); Makeshwar Kothandaraman, Whitehall, PA (US); John C. Kriz, Palmerton, PA (US); Bernard L. Morris, Emmaus, PA (US); Yehuda Smooha, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 170 days.

(21) Appl. No.: 11/535,198

(22) Filed: Sep. 26, 2006

(65) Prior Publication Data

US 2008/0074171 A1    Mar. 27, 2008

(51) Int. Cl.
*H03K 5/08* (2006.01)
(52) U.S. Cl. .......................... 327/309; 327/328; 361/56
(58) Field of Classification Search ................. 327/309, 327/315, 318–321, 325–328, 538, 544, 547; 361/56

See application file for complete search history.

(56) References Cited

U.S. PATENT DOCUMENTS

| | | | | |
|---|---|---|---|---|
| 5,677,642 A | * | 10/1997 | Rehm et al. ................. 327/65 |
| 5,973,534 A | * | 10/1999 | Singh ......................... 327/309 |
| 7,072,158 B2 | * | 7/2006 | Wang ........................... 361/56 |
| 7,098,511 B2 | * | 8/2006 | Ker et al. ..................... 257/360 |
| 7,245,467 B2 | * | 7/2007 | Yeh et al. ...................... 361/56 |
| 7,411,767 B2 | * | 8/2008 | Huang et al. .................. 361/56 |
| 2003/0235019 A1 | * | 12/2003 | Ker et al. ...................... 361/56 |
| 2006/0077601 A1 | * | 4/2006 | Ikeda et al. .................... 361/56 |
| 2006/0268478 A1 | * | 11/2006 | Lai et al. ....................... 361/56 |
| 2007/0257726 A1 | * | 11/2007 | Chen .......................... 327/407 |
| 2008/0080107 A1 | * | 4/2008 | Chow et al. .................... 361/56 |

* cited by examiner

*Primary Examiner*—Donovan Lincoln
*Assistant Examiner*—Patrick O'Neill
(74) *Attorney, Agent, or Firm*—Ryan, Mason & Lewis, LLP

(57) ABSTRACT

An IC having improved reliability includes at least first and second circuit blocks and at least first and second power domains, the first circuit block being connected to the first power domain and the second circuit block being connected to the second power domain. The IC further includes at least one control circuit configured to generate at least first and second control signals. The first control signal is operative to selectively connect the first power domain to a first voltage supply, and the second control signal is operative to selectively connect the second power domain to a second voltage supply. The IC includes at least first and second clamp circuits, the first clamp circuit being connected to the first power domain, the second clamp circuit being connected to the second power domain. Each of the clamp circuits is operative to prevent a voltage on a corresponding power domain from rising above a prescribed voltage level for the corresponding power domain.

20 Claims, 2 Drawing Sheets

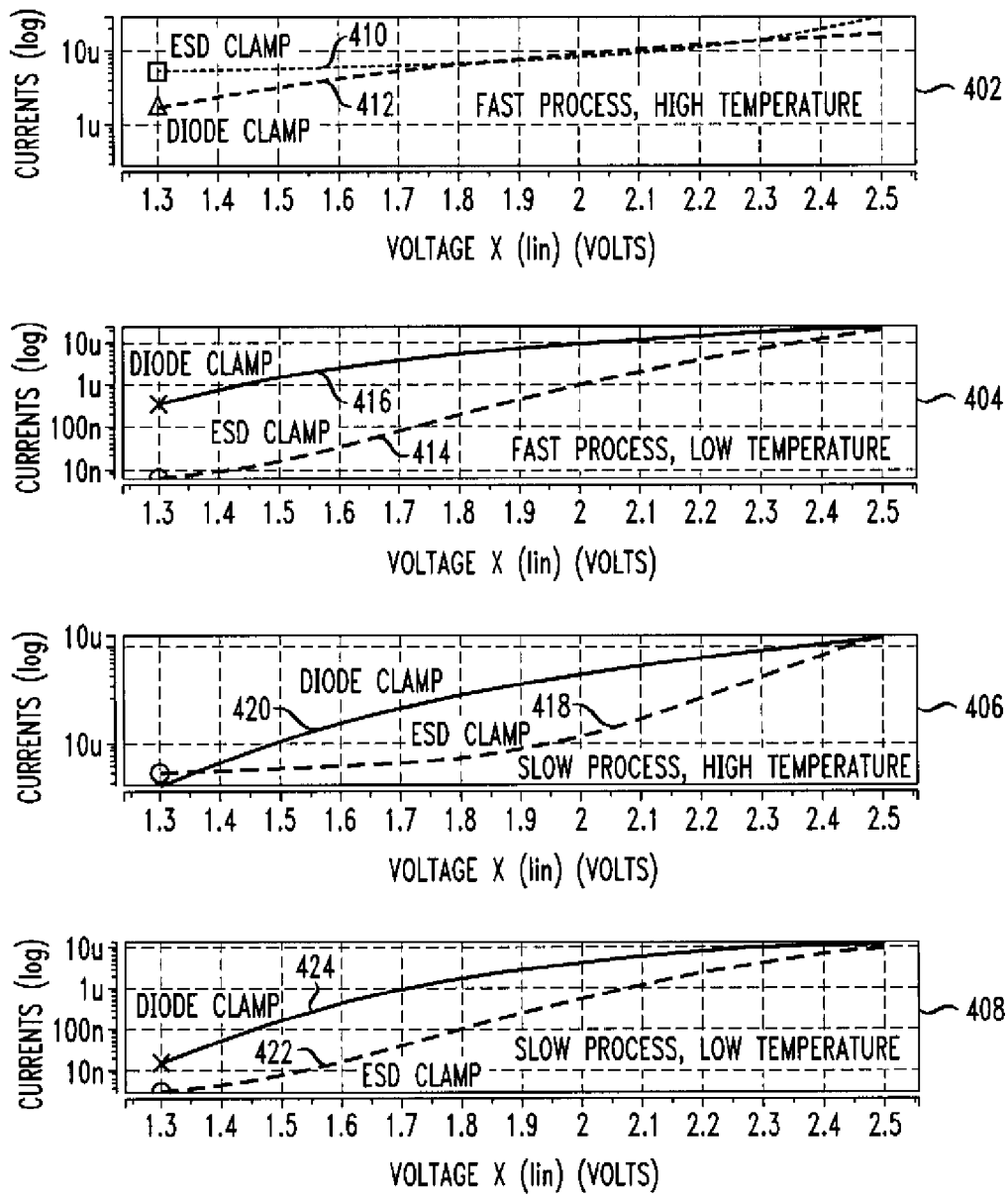

METHOD AND APPARATUS FOR IMPROVING RELIABILITY OF AN INTEGRATED CIRCUIT HAVING MULTIPLE POWER DOMAINS

FIELD OF THE INVENTION

The present invention relates generally to integrated circuits, and more particularly relates to integrated circuits employing multiple power domains.

BACKGROUND OF THE INVENTION

Modern metal-oxide-semiconductor (MOS) integrated circuit (IC) fabrication technology is capable of producing very fast transistors (e.g., several gigahertz and above). However, an undesirable side effect of these fast transistors is that they characteristically exhibit a non-negligible leakage current when they are otherwise supposed to be turned off due, at least in part, to sub-threshold effects. In portable devices, as well as other devices in which power consumption is critical, such as, for example, cell phones, laptop computers, personal digital assistants (PDAs), etc., this leakage current can significantly shorten the useful battery life of the device.

It is well known to employ circuitry which runs on two or more different voltage levels in order to reduce overall power consumption in an IC device. For instance, circuitry utilized with many portable devices may be configured so that a portion of the circuitry, such as, for example, input/output (IO) buffers, runs at a higher voltage level (e.g., about 3.3 volts), as may be supplied by an IO voltage source, while another portion of the circuitry, such as, for example, core logic, runs at a substantially lower voltage level (e.g., about 1.0 volt), as may be supplied by a core voltage source. While using multiple power domains in an IC may reduce power consumption therein, this arrangement does not reduce leakage current.

In order to reduce leakage current in an IC having multiple power domains, one or more of the power domains that are not needed at a given time may be left unconnected during at least part of the normal circuit operation. However, this approach can pose a substantial reliability risk, since the unconnected power domain on the IC may float to a voltage level high enough to damage MOS devices connected thereto. Although the unconnected power domain can be forced to ground, doing so would require changes to the printed circuit board configuration, which can be costly. Additionally, forcing the power domain to ground would increase the risk of latch-up in the IC, since N-tubs (in which p-channel MOS transistors may be formed) which are normally connected to the power domain would be connected to ground, thereby undesirably allowing a PN junction between the N-tub and substrate to become forward-biased.

Accordingly, there exists a need for reducing leakage current in an IC having multiple power domains that does not suffer from one or more of the above-noted problems exhibited by conventional ICs.

SUMMARY OF THE INVENTION

The present invention meets the above-noted need by providing, in an illustrative embodiment, techniques for reducing leakage current in an IC including multiple power domains without increasing the risk of latch-up and/or other reliability issues exhibited by conventional ICs.

In accordance with one embodiment of the invention, an IC having improved reliability includes at least first and second circuit blocks and at least first and second power domains, the first circuit block being connected to the first power domain and the second circuit block being connected to the second power domain. The IC further includes at least one control circuit configured to generate at least first and second control signals. The first control signal is operative to selectively connect the first power domain to a first voltage supply, and the second control signal is operative to selectively connect the second power domain to a second voltage supply. The IC includes at least first and second clamp circuits, the first clamp circuit being connected to the first power domain, the second clamp circuit being connected to the second power domain. Each of the clamp circuits is operative to prevent a voltage on a corresponding power domain from rising above a prescribed voltage level for the corresponding power domain.

The prescribed voltage level is preferably set so as to substantially prevent a PN junction, formed between a substrate in the IC and a well in which at least one active device in at least a given one of the first and second circuit blocks may be formed, from becoming forward-biased.

In accordance with another embodiment of the invention, a method for reducing a likelihood of latch-up in an IC having multiple power domains and respective circuit blocks connected thereto, each of the power domains being selectively connectable to respective voltage supplies corresponding thereto, includes the steps of: providing a switch between each of the voltage supplies and corresponding circuitry connected to the respective power domains; and when a given switch is configured so as to disconnect a given one of the voltage supplies from a corresponding one of the power domains, clamping the corresponding power domain so as to prevent a voltage on the corresponding power domain from rising above a prescribed voltage level.

These and other features, objects and advantages of the present invention will become apparent from the following detailed description of illustrative embodiments thereof, which is to be read in connection with the accompanying drawings.

BRIEF DESCRIPTION OF THE DRAWINGS

FIG. 4 is a graphical representation of exemplary simulation results showing relative leakage currents of the voltage clamp, and example of which is depicted in FIG. 3, and an electrostatic discharge (ESD) clamp versus applied voltage, at four different combinations of IC fabrication process and temperature, in accordance with an aspect of the invention.

DETAILED DESCRIPTION OF THE INVENTION

The present invention will be described herein in the context of ICs employing multiple power domains. It should be understood, however, that the present invention is not limited to these or any other particular circuit arrangements. Rather, the invention is more generally applicable to techniques for improving reliability of an IC having multiple power domains. Although implementations of the present invention are described herein with specific reference to p-channel MOS (PMOS) and n-channel MOS (NMOS) transistor devices, as may be formed using a complementary MOS (CMOS) fabrication process, it is to be understood that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be apparent to those skilled in the art.

Figure 1:
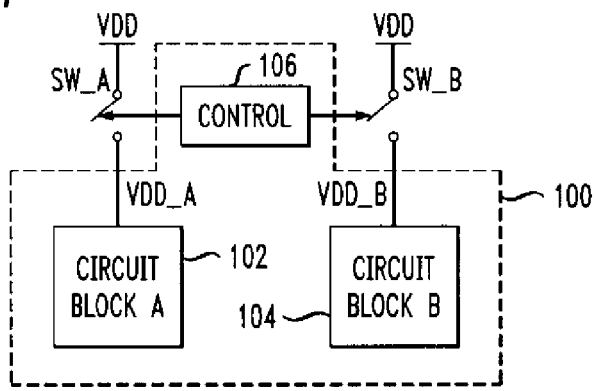
FIG. 1 is a block diagram illustrating an exemplary IC device in which techniques of the present invention may be implemented.

FIG. 1 is a block diagram illustrating an exemplary IC device 100 in which techniques of the invention may be implemented. The IC device 100 employs two local power domains, namely, VDD_A and VDD_B. The IC device 100 is divided into a first circuit block (circuit block A) 102 and a second circuit block (circuit block B) 104, with circuit block A being connected to local power domain VDD_A and circuit block B being connected to local power domain VDD_B. The two local power domains may be connected externally to the same power supply, which may be VDD as shown. In other applications, however, the two local power domains may be connected to different external power supplies. For example, circuit block 102 may comprise core logic circuitry and the local power domain VDD_A supplying power thereto may be connected to a lower core supply voltage, VDDCORE, which may be about 1.0 volt. Likewise, circuit block 104 may comprise IO circuitry and the local power domain VDD_B supplying power thereto may be connected to a higher supply voltage, VDDIO, which may be about 3.3 volts. It is to be appreciated that the present invention is not limited to these or to any other particular voltage levels.

As previously stated, modern MOS IC fabrication technology is capable of producing very fast transistors. However, an undesirable side effect of these fast transistors is that they characteristically exhibit non-negligible leakage current when they are otherwise supposed to be turned off, due primarily to sub-threshold effects. One technique to minimize this leakage current is to disconnect the power supply to a portion of the IC that is not needed at a given time. This can be accomplished, for example, by placing a relay, or alternative switching circuitry, in series between each of the local power domains and the corresponding power supplies connected thereto. With reference to FIG. 1, a first switch, SW_A, is connected in series between local power domain VDD_A and external power supply VDD, and a second switch SW_B, is connected in series between local power domain VDD_B and external power supply VDD. Switches SW_A and SW_B are preferably included, for example, on a printed circuit board connecting the system level power supply VDD to the IC 100, although the switches may alternatively reside elsewhere, such as in the power supply itself or in the IC.

Switches SW_A and SW_B may be selectively controlled by control circuitry 106 included in the IC 100. If there is a task that the IC as a whole must process that does not require the use of circuitry in circuit block 104, switch SW_B can be opened, thereby disconnecting local power domain VDD_B from the system level supply VDD and essentially eliminating any leakage current otherwise attributable to the second circuit block. When circuit block 104 is needed again, switch SW_B is closed, thereby connecting local power domain VDD_B to VDD. Likewise, if there is a task that the IC as a whole must process that does not require the use of circuitry in circuit block 102, switch SW_A can be opened, thereby disconnecting local power domain VDD_A from the system level supply VDD and essentially eliminating any leakage current otherwise attributable to the first circuit block. When circuit block 102 is needed again, switch SW_A is closed, thereby connecting local power domain VDD_A to VDD.

An unintended side effect of disconnecting the power supply to part of the IC, however, is that the disconnected local power domain can float up to a voltage level which is high enough to damage MOS transistors connected thereto. By way of example only, consider 1.0 volt core transistors formed using a 90 nanometer (nm) IC fabrication process. These core transistors break down catastrophically at about 4.5 volts and will have their performance adversely affected by any voltage greater than about 1.32 volts. A driving force that could cause the local, unconnected power domain (or domains) to be forced above ground is charge pumping due, at least in part, to capacitive coupling with those parts of the IC that are still active.

Since the unconnected circuit block (or blocks) do have inherent leakage, this leakage will help drain off at least some of the induced voltage. However, sub-threshold leakage is highly sensitive to variations in IC process, voltage and/or temperature (PVT). For instance, in a 90 nm IC fabrication process, the leakage current associated with an ESD clamp comprising a 3000 micrometer (μm) wide NMOS device at an applied voltage of 1.5 volts can vary from about 6 microamperes (μA) at a fast process and high temperature (e.g., about 100 degrees Celsius), to about 7 nanoamperes (nA) at a slow process and low temperature (e.g., about 0 degrees Celsius). At applied voltages above about 2.5 volts, this ESD clamp will sink at least 10 μA under nearly all conditions and should therefore protect the transistors from voltage above this level. At applied voltages between about 1.4 volts and about 2.0 volts, however, the ESD clamp in the IC may not conduct enough current to bleed off the capacitively induced charge on the unconnected local power domain.

As stated above, although the unconnected local power domain can be forced to ground, doing so would require changes to the printed circuit board configuration, which can be costly. Additionally, forcing the local power domain to ground would undesirably increase the risk of latch-up in the IC since N-tubs, in which PMOS transistors may be formed, which are normally connected to the local power domain, would be connected to ground, thereby allowing a PN junction between the N-tub and substrate to become forward-biased.

Figure 2:
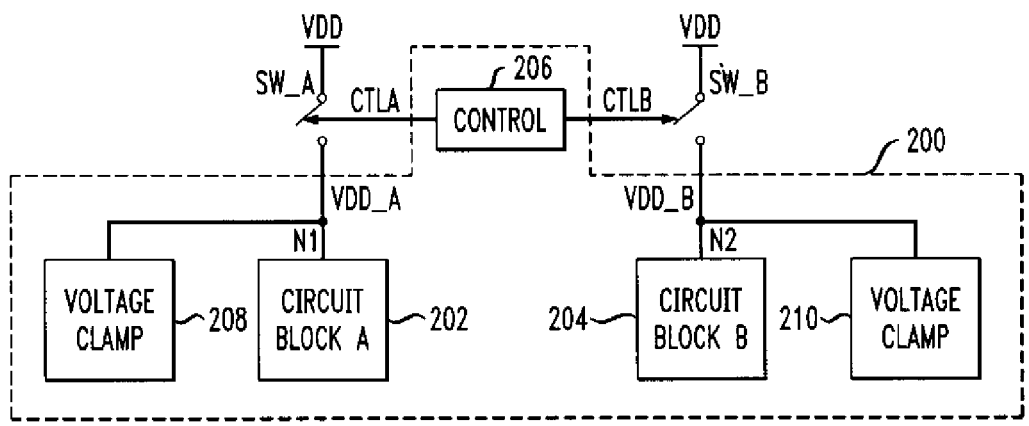
FIG. 2 is a block diagram depicting an exemplary IC device in which techniques of the present invention are implemented, in accordance with an embodiment of the present invention.

FIG. 2 is a block diagram depicting an exemplary IC device 200 in which techniques of the present invention are implemented, in accordance with an embodiment of the invention. The IC device 200 includes two local power domains, namely, VDD_A and VDD_B, although the invention is not limited to the number of local power domains shown. The IC device 200 is preferably divided into at least a first circuit block (circuit block A) 102 and a second circuit block (circuit block B) 104, with circuit block A being connected to local power domain VDD_A and circuit block B being connected to local power domain VDD_B. Of course, the invention is not limited to the number of circuit blocks shown. Additionally, more than one circuit block may be connected to a given local power domain.

The local power domains VDD_A, VDD_B are preferably electrically and physically separate from one another (e.g., isolated), at least within the IC, but may be connected externally to the same system level power supply, such as, for example, VDD. Voltage supply VDD may be about 1.2 volts, although the invention is not limited to any particular voltage level. Alternatively, the respective local power domains may be connected to different external power supplies. For example, circuit block 202 may comprise core logic circuitry and the local power domain VDD_A supplying power thereto may be connected to a lower core supply voltage, VDDCORE, which may be about 1.0 volt. Likewise, circuit block 204 may comprise IO circuitry and the local power domain VDD_B supplying power thereto may be connected to a higher supply voltage, VDDIO, which may be about 3.3 volts. It is to be appreciated that the present invention is not limited to these or to any other particular voltage levels.

In order to minimize leakage current in the IC 200, the power supply to at least a portion of the IC that is not needed at a given time may be disconnected. This can be accomplished, for example, by placing a switch, or alternative switching circuitry (e.g., relay, pass gate, transistor, etc.), in series between one or more of the local power domains (e.g., VDD_A, VDD_B) and the corresponding power supply connected thereto, which may be VDD in the illustrative embodiment shown in FIG. 2. A first switch, SW_A, is preferably connected in series between local power domain VDD_A and external power supply VDD, and a second switch, SW_B, is connected in series between local power domain VDD_B and VDD. Switches SW_A and SW_B preferably reside on a printed circuit board connecting the system level power supply VDD to the IC 200, although the switches may alternatively reside elsewhere, such as in the power supply itself or in the IC.

Switches SW_A and SW_B may be selectively controlled by control circuitry 206 included in the IC 200. Control circuitry 206 may include at least one processor operative to determine whether or not a given one of the first and second circuit blocks 202, 204 is being utilized at any given time. To perform this function, control circuitry 206 may include an activity detection circuit, or other detection means. Alternatively, such activity detection function may be performed by the processor itself When a given circuit block is not being utilized to perform a task to be processed by the IC 200 as a whole, the processor is preferably operative to generate one or more control signals for disconnecting the local power domain corresponding to the given circuit block from the corresponding system level power supply, in this case, VDD.

Specifically, when there is a task to be processed by the IC as a whole that does not require the use of circuitry in circuit block 204, switch SW_B can be opened, for example, by way of a control signal, CTLB, generated by control circuit 206. In this manner, local power domain VDD_B can be selectively disconnected from the system level supply VDD, thereby substantially eliminating any leakage current otherwise attributable to circuit block 204. When circuit block 204 is needed again, switch SW_B can be closed, for example, by way of control signal CTLB, thereby connecting local power domain VDD_B to VDD. Likewise, when there is a task to be processed by the IC as a whole that does not require the use of circuitry in circuit block 202, switch SW_A can be opened, for example, by way of a control signal, CTLA, generated by control circuit 206. In this manner, local power domain VDD_A can be selectively disconnected from the system level supply VDD, thereby substantially eliminating any leakage current otherwise attributable to circuit block 202. When circuit block 202 is needed again, switch SW_A is closed, for example, by way of control signal CTLA, thereby connecting local power domain VDD_A to VDD.

Switch SW_A may comprise, for example, an NMOS device including a source connected to local power domain VDD_A, a drain adapted for connection to VDD, and a gate adapted for receiving control signal CTLA. Likewise, switch SW_B may comprise an NMOS device including a source connected to local power domain VDD_B a drain adapted for connection to VDD, and a gate adapted for receiving control signal CTLB. The present invention contemplates alternative switching circuitry. It is to be appreciated that, because a MOS device is symmetrical in nature, and thus bi-directional, the assignment of source and drain designations in the MOS device is essentially arbitrary. Therefore, the source and drain may be referred to herein generally as first and second source/drain, respectively, where "source/drain" in this context denotes a source or a drain.

To reduce the likelihood of latch-up occurring in the IC 200 as a result of a PN junction between a substrate and N-wells (in which PMOS transistors may be formed) in the IC becoming forward-biased, the IC further includes a voltage clamp, or alternative clamping circuit, coupled to each local power supply domain. Specifically, IC 200 preferably includes a first voltage clamp 208 connected to the local power domain VDD_A of circuit block 202 at node N1, and a second voltage clamp 210 coupled to the local power domain VDD_B of circuit block 204 at node N2. Each of the voltage clamps 208 and 210 preferably increases the leakage current in a certain voltage range, such as, for example, about 1.4 volts to about 2.0 volts, so as to prevent the voltage on a corresponding local power domain from rising above a prescribed voltage level. This prescribed voltage level is preferably substantially equal to or less than a maximum voltage at which transistors in the corresponding circuit block can withstand before experiencing degradation in performance. For 1.0 volt core transistors, this maximum voltage is about 1.32 volts, as previously stated.

The techniques of the present invention may be implemented in a system including at least one apparatus comprising two or more independent circuit blocks, each of the circuit blocks being connected to a corresponding local power domain by way of a corresponding switch, an example of which is shown in FIG. 2. Suitable apparatus for implementing the techniques of the invention may include, but are not limited to, handheld devices (e.g., personal digital assistants (PDAs), cell phones, etc.), portable global positioning system (GPS) units, portable computing devices (e.g., laptop computer), MP3 player, as well as other devices in which power consumption is critical. A device incorporating the techniques of the invention may include the capability to communicate with one or more other devices in the system, although such communication capability is not a requirement of the invention. Techniques of the invention described herein may be employed in such a system for advantageously reducing power consumption therein.

Figure 3:
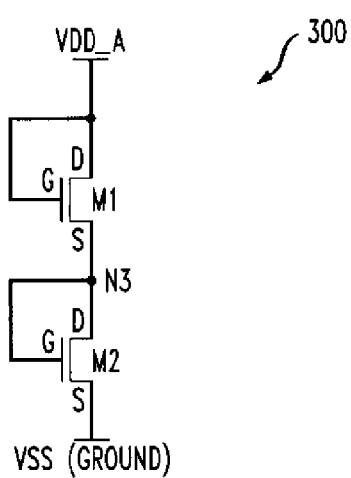
FIG. 3 is a schematic diagram depicting an exemplary voltage clamp suitable for use in the IC device shown in FIG. 2, in accordance with an embodiment of the present invention.

FIG. 3 is a schematic diagram depicting an exemplary voltage clamp 300 suitable for use in the IC 200 shown in FIG. 2, in accordance with an aspect of the invention. It is to be understood that voltage clamp 300 is merely illustrative, and that the invention similarly contemplates alternative clamp circuit arrangements, as may become apparent to those skilled in the art in view of the teachings herein.

Voltage clamp 300 preferably includes a pair of high voltage NMOS transistors configured as two diodes connected together in series between a local power domain, which may be VDD_A (or VDD_B), and a supply return, which may be VSS or ground. Specifically, a first high voltage NMOS transistor, M1, includes a drain (D) and a gate (G) adapted for connection to local power domain VDD_A. A source (S) of transistor M1 is connected to a drain and a gate of a second high voltage NMOS transistor, M2, at node N3, and a source of M2 is adapted for connection to VSS. It is to be appreciated that, because a MOS device is symmetrical in nature, and thus bi-directional, the assignment of source and drain designations in the MOS device is essentially arbitrary. Therefore, the source and drain may be referred to herein generally as first and second source/drain, respectively, where "source/drain" in this context denotes a source or a drain.

The voltage clamp 300 is not limited to the particular number of transistors shown. For instance, in an alternative embodiment, voltage clamp 300 may include three low voltage NMOS transistors in place of high voltage NMOS transistors M1 and M2, each transistor being configured in a diode arrangement, connected together in series between local power domain VDD_A and VSS. Voltage clamp 300 may alternatively include diode-connected PMOS devices in place of one or more of the NMOS devices.

Traditional mixed signal integrated circuit processes typically offer both "high voltage" and "low voltage" transistor devices. The high voltage devices generally have a nominal threshold voltage of about 0.75 volts and are intended to operate with a higher supply voltage, which may be VDDIO (e.g., about 3.3 volts). The low voltage devices have a nominal threshold voltage which is substantially lower than the high voltage devices, such as, for example, about 0.35 volt, and are intended to operate with a lower core supply voltage, which may be VDDCORE (e.g., about 1.0 volt).

By way of example only, and without loss of generality, with NMOS devices M1 and M2 each sized having a channel width (W) equal to about 1 μm and a channel length (L) equal to about 2 μm, the maximum leakage current through voltage clamp 300 will be about 30 percent of the leakage current through an ESD clamp in the IC at a maximum voltage of normal operation of about 1.32 volts. This maximum leakage current occurs with a fast IC fabrication process at high temperature.

FIG. 4 is a graphical representation of exemplary simulation results showing relative leakage currents (in log Amperes) of the voltage clamp (Diode clamp), an example of which is depicted in FIG. 3, and ESD clamp (not shown) versus applied voltage (in linear volts), at four different combinations of IC fabrication process and temperature, in accordance with an aspect of the invention. Traces 410 and 412 in panel 402 represent sub-threshold current for the ESD clamp and voltage clamp, respectively, at fast process and high temperature, traces 414 and 416 in panel 404 represent sub-threshold current for the ESD clamp and voltage clamp, respectively, at fast process and low temperature, traces 418 and 420 in panel 406 represent sub-threshold current for the ESD clamp and voltage clamp, respectively, at slow process and high temperature, and traces 422 and 424 in panel 408 represent sub-threshold current for the ESD clamp and voltage clamp, respectively, at slow process and low temperature.

As apparent from the figure, at fast process and high temperature, the sub-threshold leakage current of the ESD clamp is greater than that of the voltage clamp. However, as is shown in panels 404, 406 and 408, the leakage current of the voltage clamp can be considerably greater than that of the ESD clamp under other process and temperature conditions. For example, at fast process and low temperature, the voltage clamp can sink about 100 times more current than the ESD clamp at an applied voltage of about 1.5 volts, and about 18 times more current at an applied voltage of 1.9 volts.

Techniques of the present invention may be implemented in a system (e.g., a communication system) including at least one apparatus (e.g., a receiver or transmitter) which is arranged into multiple circuit blocks, each of the circuit blocks being connected to a corresponding power domain. Specifically, the apparatus preferably includes at least first and second power domains, a first circuit block being connected to the first power domain and a second circuit block being connected to the second power domain. A control circuit in the apparatus is configured to generate at least first and second control signals. The first control signal is operative to selectively connect the first power domain to a first voltage supply and the second control signal is operative to selectively connect the second power domain to a second voltage supply. The apparatus further includes at least first and second clamp circuits, the first clamp circuit being connected to the first power domain and the second clamp circuit being connected to the second power domain. Each clamp circuit is operative to prevent a voltage on its corresponding power domain from rising above a prescribed voltage level for the corresponding power domain.

At least a portion of the techniques of the present invention may be implemented in one or more integrated circuits. In forming integrated circuits, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An integrated circuit, comprising:
   at least first and second circuit blocks;
   at least first and second power domains, the first circuit block being connected to the first power domain and the second circuit block being connected to the second power domain;
   at least one control circuit configured to generate at least first and second control signals, the first control signal being operative to selectively connect the first power domain to a first voltage supply, the second control signal being operative to selectively connect the second power domain to a second voltage supply, the first and second control signals being generated independently of one another; and
   at least first and second clamp circuits, the first clamp circuit being connected to the first power domain, the second clamp circuit being connected to the second power domain, wherein each of the first and second clamp circuits is operative to prevent a voltage on its corresponding power domain from rising above a prescribed voltage level for the corresponding power domain.

2. The integrated circuit of claim 1, wherein the prescribed voltage level is set so as to substantially prevent a PN junction, formed between a substrate in the integrated circuit and a well in which at least one active device in at least a given one of the first and second circuit blocks may be formed, from becoming forward-biased.

3. The integrated circuit of claim 1, wherein the prescribed voltage level for the corresponding power domain is substantially equal to or less than a maximum voltage at which at least one active device in at least a given one of the first and second circuit blocks coupled to the corresponding power domain can withstand without experiencing degradation in performance.

4. The integrated circuit of claim 1, wherein at least one of the first and second clamp circuits comprises a plurality of high voltage transistor devices, each of the transistor devices being configured in a diode arrangement, the transistor devices being connected together in series between a corresponding one of the power domains and a voltage return of the integrated circuit.

5. The integrated circuit of claim 4, wherein each of the plurality of transistor devices comprises at least one of an NMOS device and a PMOS device.

6. The integrated circuit of claim 1, wherein at least one of the first and second clamp circuits comprises at least first and second high voltage NMOS devices, a first source/drain and a gate of the first NMOS device being adapted for connection to a corresponding one of the power domains, a second source/drain of the first NMOS device being connected to a first source/drain and a gate of the second NMOS device, and a second source/drain of the second NMOS device being adapted for connection to a voltage return of the integrated circuit.

7. The integrated circuit of claim 1, wherein at least one of the first and second clamp circuits comprises at least first, second and third low voltage NMOS devices, a first source/drain and a gate of the first NMOS device being adapted for connection to a corresponding one of the power domains, a second source/drain of the first NMOS device being connected to a first source/drain and a gate of the second NMOS device, a second source/drain of the second NMOS device being connected to a first source/drain and a gate of the third NMOS device, and a second source/drain of the third NMOS device being adapted for connection to a voltage return of the integrated circuit.

8. The integrated circuit of claim 1, further comprising at least first and second switch circuits, the first switch circuit being connected between the first power domain and the first voltage supply and being adapted for selectively connecting the first power domain to the first voltage supply as a function of the first control signal, the second switch circuit being connected between the second power domain and the second voltage supply and being adapted for selectively connecting the second power domain to the second voltage supply as a function of the second control signal.

9. The integrated circuit of claim 8, wherein the first switch circuit comprises an NMOS device including a first source/drain connected to the first power domain, a second source/drain adapted for connection to the first voltage supply, and a gate adapted for receiving the first control signal.

10. The integrated circuit of claim 8, wherein the second switch circuit comprises an NMOS device including a first source/drain connected to the second power domain, a second source/drain adapted for connection to the second voltage supply, and a gate adapted for receiving the second control signal.

11. The integrated circuit of claim 1, wherein the control circuit comprises at least one processor operative: (i) to determine whether a given one of the first and second circuit blocks is being utilized at a given time; and (ii) when the given one of the first and second circuit blocks is not being utilized, to disconnect the power domain corresponding to the given circuit block from the corresponding voltage supply.

12. The integrated circuit of claim 1, wherein the first voltage supply and the second voltage supply are the same.

13. The integrated circuit of claim 1, wherein the first and second power domains are electrically isolated from one another at least within the integrated circuit.

14. The integrated circuit of claim 1, wherein the at least one control circuit comprises an activity detection circuit operative to determine whether or not a given one of the first and second circuit blocks is being utilized at a given time, at least one of the first and second control signals being indicative of whether or not a corresponding one of the first and second circuit blocks is being utilized at a given time.

15. A method for reducing a likelihood of latch-up in an integrated circuit having multiple power domains and respective circuit blocks connected thereto, each of the power domains being selectively connectable to respective voltage supplies corresponding thereto, the method comprising the steps of:
providing a switch between each of the voltage supplies and corresponding circuitry connected to the respective power domains, each switch being independently controlled; and
when a given switch is configured so as to disconnect a given one of the voltage supplies from a corresponding one of the power domains, clamping the corresponding power domain so as to prevent a voltage on the corresponding power domain from rising above a prescribed voltage level.

16. The method of claim 15, further comprising the step of setting the prescribed voltage level so as to substantially prevent a PN junction, formed between a substrate in the integrated circuit and a well in which at least one active device in at least a given one of the circuit blocks may be formed, from becoming forward-biased.

17. The method of claim 15, wherein the prescribed voltage level is substantially equal to or less than a maximum voltage at which at least one active device in at least a given one of the circuit blocks coupled to a corresponding power domain can withstand without experiencing degradation in performance.

18. The method of claim 15, further comprising the steps of:
determining whether a given one of the circuit blocks is being utilized at a given time; and
when the given one of the circuit blocks is not being utilized, disconnecting the power domain corresponding to the given circuit block from a corresponding voltage supply.

19. A system including at least one apparatus, the at least one apparatus comprising:
at least first and second circuit blocks;
at least first and second power domains, the first circuit block being connected to the first power domain and the second circuit block being connected to the second power domain;
at least one control circuit configured to generate at least first and second control signals, the first control signal being operative to selectively connect the first power domain to a first voltage supply, the second control signal being operative to selectively connect the second power domain to a second voltage supply, the first and second control signals being generated independently of one another; and
at least first and second clamp circuits, the first clamp circuit being connected to the first power domain, the second clamp circuit being connected to the second power domain, wherein each of the first and second clamp circuits is operative to prevent a voltage on its corresponding power domain from rising above a prescribed voltage level for the corresponding power domain.

20. The system of claim 19, wherein the at least one apparatus is implemented in at least one of a personal digital assistant, a MP3 player, a cell phone, and a portable computing device.

* * * * *